United States Patent
Ikeda et al.

(10) Patent No.: US 7,564,127 B2
(45) Date of Patent: Jul. 21, 2009

(54) MEMORY MODULE THAT IS CAPABLE OF CONTROLLING INPUT/OUTPUT IN ACCORDANCE WITH TYPE OF MEMORY CHIP

(75) Inventors: Hiroaki Ikeda, Tokyo (JP); Masakazu Ishino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 479 days.

(21) Appl. No.: 11/404,785

(22) Filed: Apr. 17, 2006

(65) Prior Publication Data

US 2006/0235577 A1    Oct. 19, 2006

(30) Foreign Application Priority Data

Apr. 19, 2005   (JP)   ............... 2005-121210

(51) Int. Cl.
*H01L 23/02* (2006.01)
*H01L 21/44* (2006.01)
(52) U.S. Cl. ..................... 257/686; 438/109
(58) Field of Classification Search ............ 257/686, 257/723, 774, 777; 438/107, 109
See application file for complete search history.

(56) References Cited

U.S. PATENT DOCUMENTS 4,074,342 A * 2/1978 Honn et al. ............... 361/779
2002/0132463 A1 * 9/2002 Urushima .................. 438/613

FOREIGN PATENT DOCUMENTS

JP    6-291250    10/1994
JP    2004-327474    11/2004

* cited by examiner

*Primary Examiner*—Calvin Lee
(74) *Attorney, Agent, or Firm*—McGinn IP Law, PLLC

(57) ABSTRACT

A memory module of the present invention is provided with a memory core chip that is placed between an interface chip and an interposer chip and has a relay wire for electrically connecting these chips, an interposer chip that transmits type-information, that is information showing the type of the memory core chip, to the interface chip through the relay wire, and the interface chip that controls the memory core chip in accordance with the type-information received from the interposer chip.

17 Claims, 8 Drawing Sheets

MEMORY MODULE THAT IS CAPABLE OF CONTROLLING INPUT/OUTPUT IN ACCORDANCE WITH TYPE OF MEMORY CHIP

BACKGROUND OF THE INVENTION

1. Field of the Invention

The present invention relates to a memory module having a semiconductor memory chip.

2. Description of the Related Art

Conventionally, there is known a memory module in which memory IC chips are layered. Representative memory modules are disclosed in Japanese Patent Laid-Open No. 06-291250 (hereinafter, called Patent Document 1) and Japanese Patent Laid-Open No. 2004-327474 (hereinafter, called Patent Document 2).

In the memory module disclosed in Patent Document 2, an IO (Input/Output) chip is laid on an interposer substrate, and a plurality of DRAM (Dynamic Random Access Memory) chips are layered on the IO chip. The DRAM chip is provided with a through-electrode for conducting an electric signal from one surface to the other surface. The IO chip transmits and receives a signal and data to/from the DRAM chip according to a signal that is input from the outside through the interposer substrate. At this time, the IO chip can transmit and receive data to/from any DRAM chip by the through-electrode in the DRAM chips.

According to the memory module disclosed in Patent Document 2, the through-electrode must be provided in the IO chip, and the method for manufacturing the IO chip requires that there be a process to form the through-electrode.

Further, concerning data input/output of the DRAM chip, the interposer substrate is determined in accordance with the data bus width, such as four bits or eight bits. Even if it is fabricated, as is, no information of the data bus width is transmitted to the IO chip. Though the interposer substrate that corresponds to the data bus width of four bits is used, when the IO chip is initially set to the data bus width of eight bits, the IO chip attempts to output data of the 8-bits data bus width through the interposer substrate. To prevent this problem from occurring, the IO chip must be replaced together with the interposer substrate in accordance with the data bus width, and thus the cost of manufacturing is increased.

SUMMARY OF THE INVENTION

It is an object of the present invention to provide a memory module in which the operation changes in accordance with the types of memory chips.

According to the present invention, a memory module has a memory core chip stored with information, an interface chip for controlling input and output of data of the memory core chip, and an interposer chip for transmitting and receiving the data between the interface chip and the outside: wherein the memory core chip is placed between the interface chip and the interposer chip and has a relay wire for electrically connecting the interface chip and the interposer chip; wherein the interposer chip transmits type-information, that is information showing the type of the memory core chip, to the interface chip through the relay wire; and wherein the interface chip controls the memory core chip in accordance with the type-information received from the interposer chip.

According to the present invention, since the type-information is input from the interposer chip to the interface chip through the relay wire in the memory core chip, the interface chip can be controlled in accordance with the type of the memory core chip. Accordingly, the interface chip must not be replaced when the interposer chip is changed in accordance with the type of the memory core chip, and thus it is possible to prevent the cost of manufacturing from increasing.

The above and other objects, features and advantages of the present invention will become apparent from the following description with reference to the accompanying drawings which illustrate examples of the present invention.

DETAILED DESCRIPTION OF THE PREFERRED EMBODIMENTS

The memory module of the present invention is characterized in that a memory chip is placed between an interposer chip and an interface chip that controls input and output and the interposer chip transmits information about the type of the memory chip to the interface chip.

First Embodiment

The configuration of the memory module according to the first embodiment is explained. In the first embodiment, a synchronous DRAM is used as memory.

Figure 1:
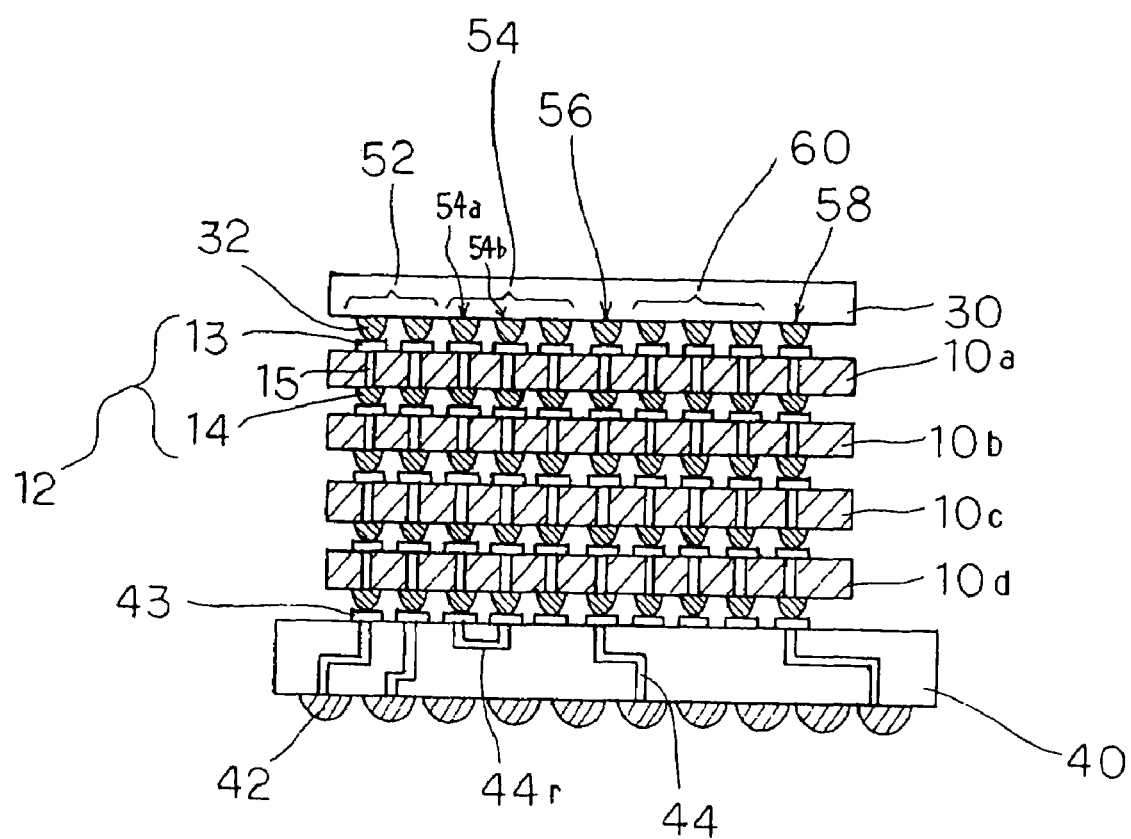
FIG. 1 is a schematic cross-sectional view for explaining one example of the configuration of a memory module according to a first embodiment.

FIG. 1 is a schematic cross-sectional view for explaining one example of the configuration of a memory module according to the first embodiment.

As shown in FIG. 1, the memory module according to the first embodiment has memory core chips 10a to 10d stored with information, interposer chip 40 for transmitting and receiving a signal to/from the outside, and interface chip 30 that controls transmission and reception of data to/from memory core chips 10a to 10d in accordance with a control signal received from interposer chip 40. Interposer chip 40 is provided with solder ball 42 that is a terminal for electrically connecting to the outside, and wire 44 and bump 43 for electrically connecting solder ball 42 and memory core chip 10. Incidentally, the number of layers of the memory core chips may be freely set, however, four layers are arranged in the first embodiment. Additionally, in the following description, the numeral reference 10 is used for common elements in memory core chips 10a to 10d.

As shown in FIG. 1, memory chip 10 is provided with through-electrodes 12 that enable transmission and reception of signals and data between the upper layer chip and the lower layer chip. Through-electrodes 12 include two kinds, i.e., electrodes that are not connected to the internal circuit of memory core chip 10 and electrodes that are connected to the internal circuit.

Through-electrodes 12 that are not connected to the internal circuit of memory core chip 10 function as wires for electrically connecting interposer chip 40 and interface chip 30. Input/output signal line 52 shown in FIG. 1 is a signal line that is used to input and output a control signal and data from/to the outside. Through-electrode 12 in input/output signal line 52 is not connected to the internal circuit of memory core chip 10. Further, the memory module according to the first embodiment is provided with signal lines 60 for informing interface chip 30 of type-information that is information showing the type of memory core chip 10. In the first embodiment, type-information means data bus widths concerning input/output of memory core chip 10. In the first embodiment, three signal lines are used as signal lines 60 for sending type-information. Through-electrode 12 in signal line 60 for sending type-information is also not connected to the internal circuit of memory core chip 10 for that reason. In this case, through-electrode 12 functions as a wire for relaying the signal and data between interface chip 30 and interposer chip 40.

On the other hand, through-electrodes 12 that are connected to the internal circuit of memory chip 10 transmit the signal and data communicated between the external and internal circuits to another chip. Memory core common lines 54 shown in FIG. 1 are wires for transmitting and receiving the signal and data between interface chip 30 and memory core chip 10. For that reason, through-electrode 12 in memory core common line 54 is connected to the internal circuit of its chip. Through-electrodes 12 in power supply line 56 and ground potential line 58 are connected to the internal circuit of memory core chip 10, and potentials are respectively applied to internal circuits of memory core chip and the upper layer chip. Lines 54a, 54b from memory core common lines 54 are not connected to solder ball 42 in interposer chip 40 but are connected to each other by wire 44r. Memory core common lines 54a, 54b function in a manner that the signal output from interface chip 30, through one of the lines, is returned to interface chip 30 through the other line. The uses of memory core common lines 54a, 54b will be described later.

Incidentally, in FIG. 1, no configuration is shown of the internal circuits of interface chip 30 and memory core chip 10. Also, there is no limitation to the number of input/output signal lines 52, memory core common lines 54, power supply line 56, and ground potential line 58 shown in FIG. 1. Also, a part of wires 44 in interposer chip 40 is shown in FIG. 1. Detailed explanations are given for each the configuration of chips below.

Interface chip 30 is ASIC (Application Specific Integrated Circuit) for controlling data that is to be stored in memory core chip 10. Interface chip 30 is disclosed in Patent Document 2 as the IO chip that corresponds to the configuration example thereof, and therefore detailed explanations of the configuration are omitted.

Interface chip 30 is provided with bumps 32 that are internal terminals for making electrical connections to through-electrodes 12 of memory core chip 10 that correspond to through-electrode positions. Interface chip 30 is laid over memory core chip 10a in a manner that the circuit formation surface of interface chip 30 is on the side of the circuit formation surface of memory core chip 10a.

Interface chip 30 is previously stored with information showing the type of data bus widths that corresponds to type-information. Therefore, access can be made by the data bus width, that corresponds to the type-information shown by the signal received through signal line 60 for sending type-information. In the first embodiment, it is assumed that adaptable data bus widths are four bits, eight bits, and sixteen bits. In the following description, the types that respectively correspond to the data bus widths are called "×4 article", "×8 article", and "×16 article". Interface chip 30 recognizes that the type of memory core chip 10 is "×4 article" when the type-information indicated by the signal of signal line 60 for sending type-information is (1, 1, 1). Similarly, interface chip 30 recognizes that the type of memory core chip 10 is "×8 article" when the type-information is (1, 1, 0) and recognizes that the type is "×16 article" when the type-information is (1, 0, 0).

Figure 2:
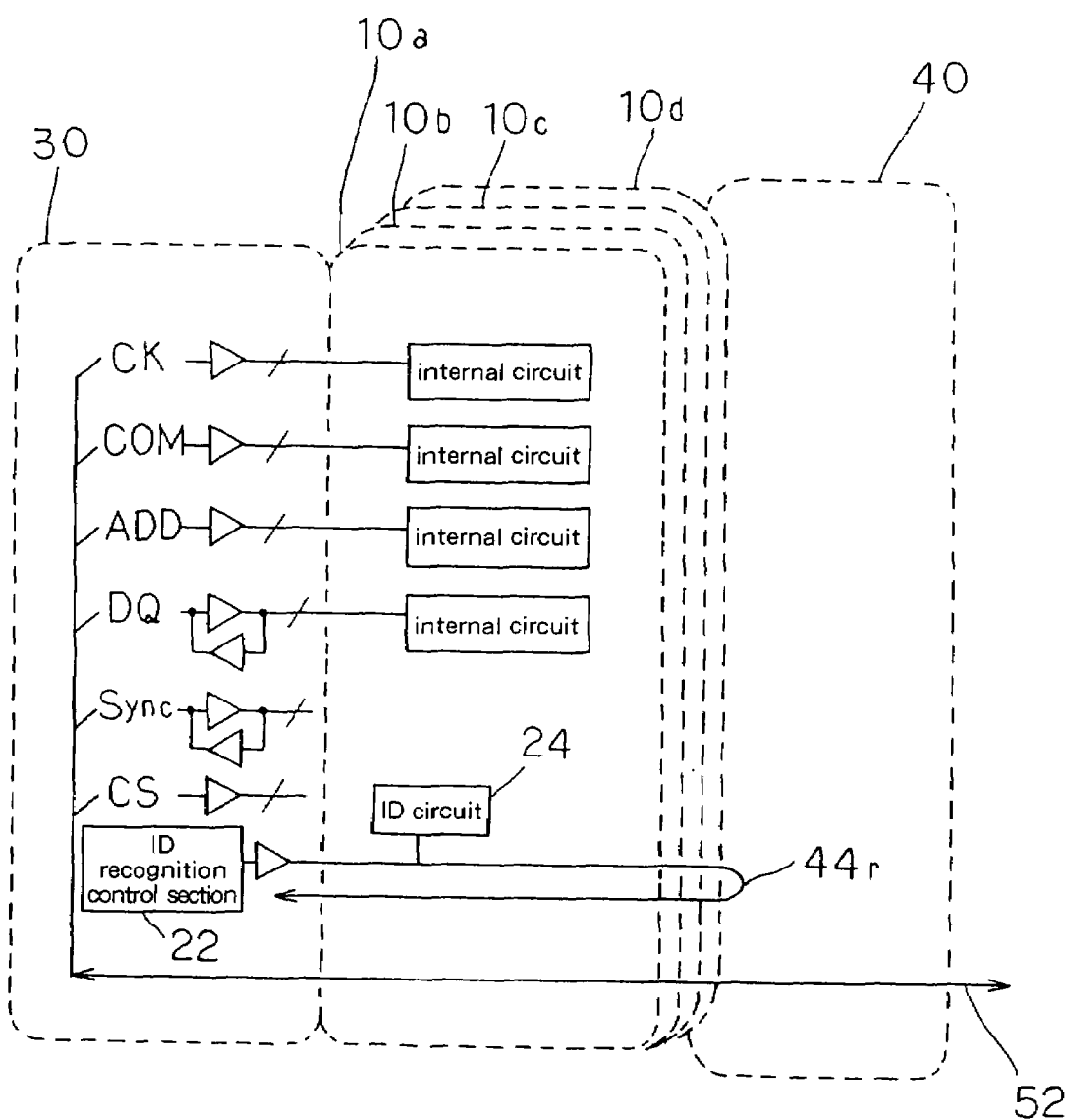
FIG. 2 is a view for explaining the transmission and reception of a signal to/from an interface chip to/from a memory core chip.

FIG. 2 is a view for explaining signal transmission and reception of a signal to/from the interface chip to/from the memory core chip.

CK signal shown in FIG. 2 is a clock signal that is a timing reference signal for signal processing. COM signal includes four signals, RAS (Row Address Strobe), CAS (Column Address Strobe), WE (Write Enable), and CKE (Clock Enable), which are handled as commands to memory core chip 10. An ADD signal is used to designate an address. DQ signal is a data signal that is to be input and output. The number of data input/output signal lines corresponds to the DQ signal width. A Sync signal is a signal for synchronization with a CK signal. A Sync signal is used for timing control with a signal from the outside and is not input to memory core chip 10. A CS (chip select) signal is a signal to make a predetermined memory core chip from among the plurality of memory core chips in action.

Further, interface chip 30 is provided with ID recognition control section 22 for recognizing ID (Identification) circuit 24, which is different for each memory core chip 10. ID recognition control section 22 identifies memory core chip 10 in accordance with a CS signal. In order to identify the number of stages of memory core chips 10 and ID circuit 24 in each memory core chip 10, interface chip 30 outputs a signal to one of memory core common lines 54a, 54b and receives a signal showing the result from the other signal line.

Next, memory core chip 10 is explained.

As shown in FIG. 1, through-electrode 12 arranged in memory core chip 10 has conductive material 15 buried into the trough hole formed in memory core chip 10, bump 13 arranged in the upper portion of conductive material 15, and bump 14 arranged in the lower portion of conductive material 15. Conductive material 15 is made of polysilicon or metal material.

Figure 3:
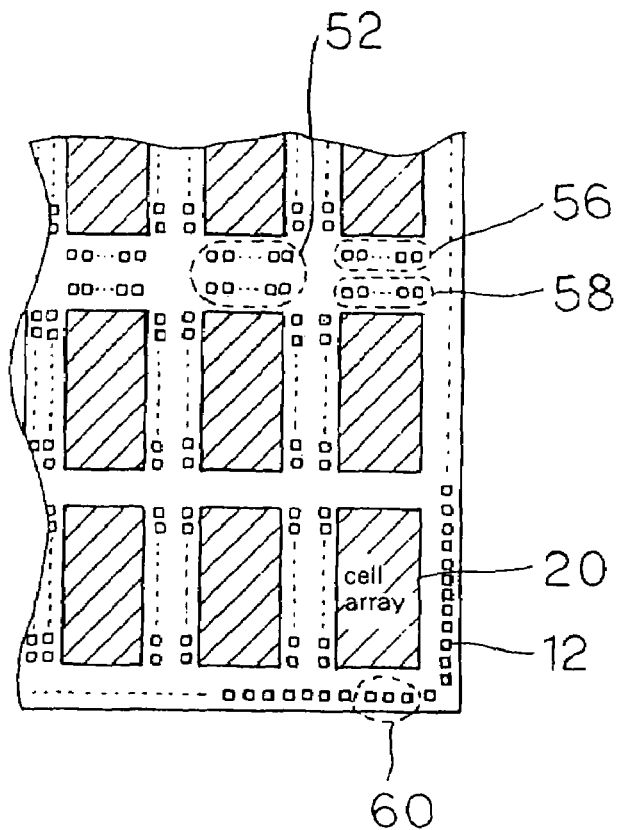
FIG. 3 is a plan view showing one example of the configuration of a memory core chip.

FIG. 3 is a plan view showing one example of the configuration of the memory core chip. FIG. 3 shows a part of the layout plan of the memory core chip. As shown in FIG. 3, through-electrodes 12 are arranged around cell array 20 in the memory cell at pitches of 50 µm. Also, through-electrodes 12 are arranged inside along the side of the chip at pitches of 50 µm. Examples of input/output signal lines 52, power supply lines 56, ground potential lines 58, and signal lines 60 for sending type-information from among the plurality of through-electrodes 12 are indicated by dashed lines. Incidentally, there is no limitation to the position and the number of input/output signal lines 52, power supply lines 56, and ground potential lines 58 shown in FIG. 3. Also, there is no limitation as to where signal lines 60 for sending type-information, as shown in FIG. 3, are placed.

Further, memory core chip 10 is provided with ID circuit 24 stored with identifier information that is different for each memory core chip 10, as shown in FIG. 2. In the first embodiment, it is assumed that the type of memory core chip 10 is "×16 article".

Next, interposer chip 40 is explained.

As is explained in FIG. 1, solder ball 42 is the external terminal for transmitting and receiving a signal to/from the outside. Wire 44 connects bump 43 to be an electrode and solder ball 42. Solder balls are formed at predetermined pitches from 0.5 to 0.8 mm. Also, the power supply voltage is applied from the outside to solder ball 42 of power supply line 56, and thus the power supply potential is applied to each chip through power source line 56. Similarly, solder ball 42 of ground potential line 58 is connected to GND, and thus each chip is connected to the ground potential.

Further, through-electrodes 12 arranged at pitches of 50 μm and solder balls 42 arranged at predetermined pitches from 0.5 to 0.8 mm are connected through bump 43 and wire 44. Therefore, interposer 40 has the function of connecting electrodes whose pitches and arrangements are different.

Figure 4:
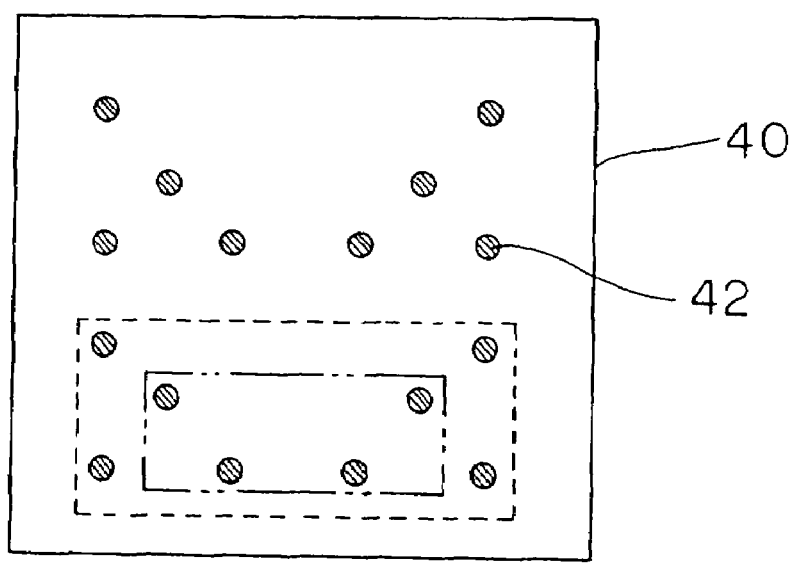
FIG. 4 is a plan view showing one example of the configuration of a solder ball formation surface.

FIG. 4 is a plan view showing one example of the configuration of the solder ball formation surface. Solder balls are formed at the above-mentioned pitches, and only DQ terminals for data input/output are shown in FIG. 4. Solder balls 42 shown in FIG. 4 are DQ terminals that are compliant with "×16 article". Solder balls 42 are connected to bumps 43 on the front side through wires 44 shown in FIG. 1. Eight solder balls that are surrounded by a dashed line are DQ terminals that are compliant with "×8 article". Four solder balls that are surrounded by a chain double-dashed line are DQ terminals that are compliant with "×4 article".

Next, explanations are given of the configuration of signal line 60 for sending type-information in interposer chip 40.

Figure 5A:
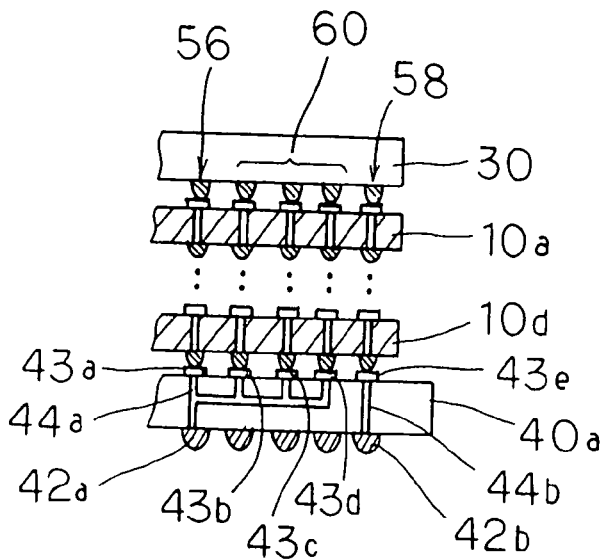
FIGS. 5A to 5C are principal cross-sectional views showing examples of the configuration of interposer chips.
Figure 5B:
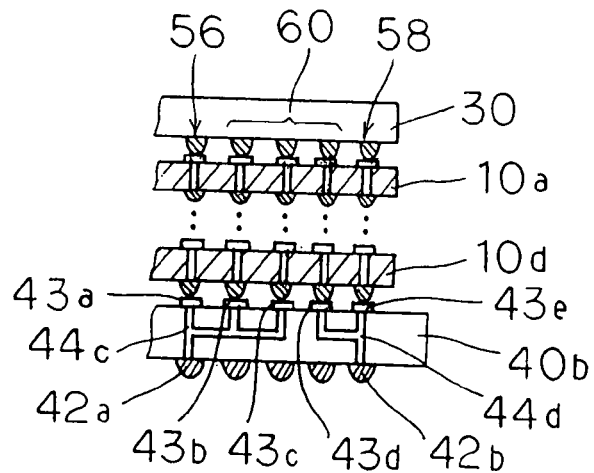
Figure 5C:
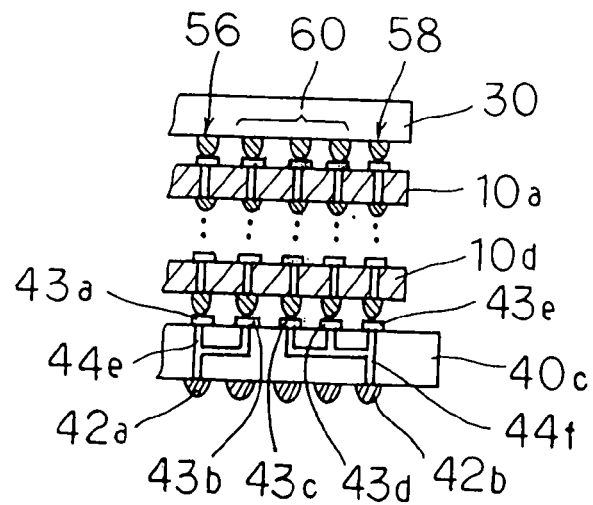

FIGS. 5A to 5C are views for explaining how the interface chip is informed about type-information. FIGS. 5A to 5C show principal cross-sectional views of interposer chip 40. A portion between memory core chips 10a and 10d is similar to that shown in FIG. 1, and therefore it is omitted in FIGS. 5A to 5C. In the first embodiment, information "1" is set when the signal line is held at the power supply potential and information "0" is set when at the ground potential. Information of one bit is made by whether the power supply potential or the ground potential.

In interposer chip 40a shown in FIG. 5A, solder ball 42a of power source line 56 is connected to bumps 43a, 43b, 43c, 43d through wire 44a. Since the power supply potential is applied to bumps 43b, 43c, 43d of signal lines 60 for sending type-information, information (1, 1, 1) is input to interface chip 30. Interface chip 30 is set as the "×4 article" type according to information (1, 1, 1) from signal line 60 for sending type-information.

In interposer chip 40b shown in FIG. 5B, solder ball 42a of power source line 56 is connected to bumps 43a, 43b, 43c through wire 44c. Also, solder ball 42b of ground potential line 58 is connected to bumps 43d, 43e through wire 44d. Since the power supply potential is applied to bumps 43b, 43c of signal lines 60 for sending type-information and since bump 43d of signal lines 60 for sending type-information is connected to the ground potential, information (1, 1, 0) is input to interface chip 30. Interface chip 30 is set as the "×8 article" type according to information (1, 1, 0) from signal line 60 for sending type-information.

In interposer chip 40b shown in FIG. 5C, solder ball 42a of power source line 56 is connected to bumps 43a, 43b through wire 44e. Also, solder ball 42b of ground potential line 58 is connected to bumps 43c, 43d, 43e through wire 44f. Since the power supply potential is applied to bumps 43b of signal lines 60 for sending type-information and since bumps 43c, 43d of signal lines 60 for sending type-information are connected to the ground potential, information (1, 0, 0) is input to interface chip 30. Interface chip 30 is set as the "×16 article" type according to information (1, 0, 0) from signal lines 60 for sending type-information. Incidentally, wires 44a to 44f are called setting wires that are used to set type-information.

Next, brief explanations are given of the operation of the memory module according to the first embodiment.

A memory module is manufactured by using one of interposers 40a to 40c, which are described above. When the manufactured memory module is mounted, the data bus width for input and output is set to interface chip 30 by the signal from signal line 60 for sending type-information. In the following description, the data is input and output according to the data bus width set by signal line 60 for sending type-information.

The operation for reading data is performed as follows. After a control signal for reading data is input from the outside to interposer chip 40 through solder ball 42, the control signal is input to interface chip 30 through input/output signal line 52. Interface chip 30 inputs a COM signal for reading data to memory core chip 10 through memory core common line 54 and designates an address by an ADD signal. Then, one of plural memory core chips 10 is operating according to CS signal, and thus the data in the designated address is output to interface chip 30 through memory core common line 54. Interface chip 30 outputs the received data to the outside through input/output signal line 52.

On the other hand, operation for writing data is performed as follows. After a control signal for data writing is input from the outside to interposer chip 40 through solder ball 42, the control signal is input to interface chip 30 through input/output signal line 52. Interface chip 30 inputs a COM signal for writing data to memory core chip 10 through memory core common line 54 and designates an address by an ADD signal. Then, one of plural memory core chips 10 is operating according to CS signal, and thus data is input to memory core chip 10 through input/output signal line 52 and memory core common line 54 and the data is written.

Figure 6:
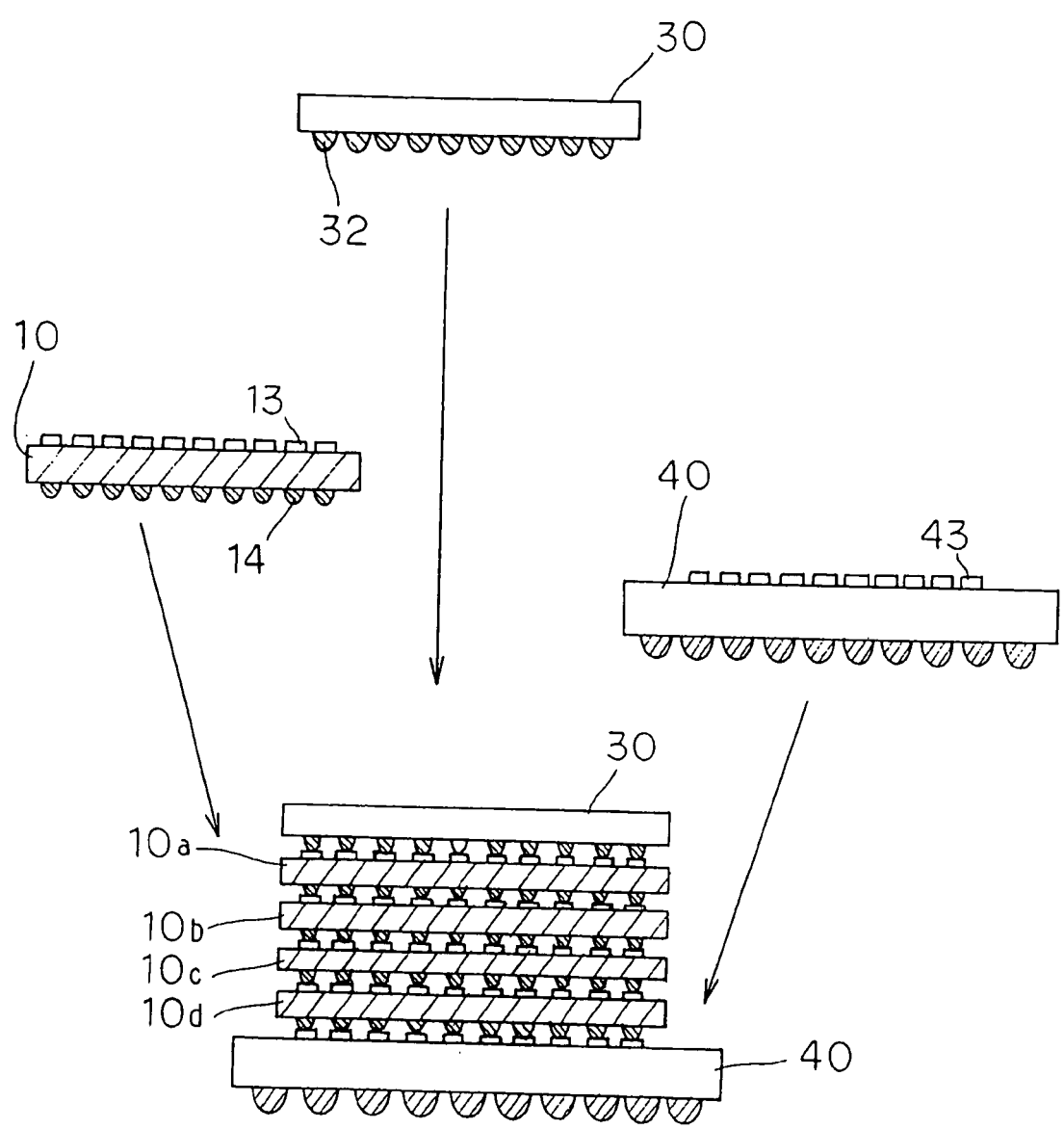
FIG. 6 is a view for explaining one example of a method of manufacturing a memory module according to the first embodiment.

Next, brief explanations are given of the method of manufacturing the memory module according to the first embodiment. In the first embodiment, the memory module is fabricated by the COC (chip on chip) method, in which after being divided from a substrate into chips, the chips are layered. FIG. 6 is a view for explaining one example of the method of manufacturing the memory module according to the first embodiment. Since FIG. 6 shows the side of the memory module, no through-electrode and no wire are shown in FIG. 6.

After memory core chips 10, interface chips 30, and interposer chips 40 are mass manufactured respectively on each substrate, chips are individually divided from each substrate. In the first embodiment, memory core chips 10 having four layers are prepared. Memory core chip 10d of the first layer is placed on interposer chip 40, and bump 14 of memory core chip is bonded to bump 43 of interposer chip 40 by thermocompression. Successively, memory core chip 10c of the second layer is placed on memory core chip 10d of the first layer, and bump 14 of memory core chip 10c of the second layer is bonded to bump 13 of memory core chip 10d of the first layer by thermocompression.

Further, memory core chips 10b, 10a of the third and forth layers are overlaid similarly to memory core chip 10c of the second layer, and through-electrodes are connected among respective layers. Then, interface chip 30 is placed on memory core chip 10a of the fourth layer in a manner such that the circuit formation surface of interface chip 30 is faced downward. Successively, bump 32 of interface chip 30 is bonded to bump 13 of memory core chip 10a of the fourth layer by thermocompression. After that, memory chips 10a to 10d and interface chip 30, which are layered, are sealed by resin, not shown.

In the memory module according to the first embodiment, since type-information is input from interposer chip 40 to interface chip 30 by through-electrode 12 of memory core chip 10, interface chip 30 can perform control in accordance with the type of memory core chip 10 that is used. Therefore, there is no need to replace interface chip 30 when interposer chip 40 is changed in accordance with the type of memory core chip 10 that is used, and it is possible to prevent the cost of manufacturing the memory module from increasing.

Also, since memory core chip 10 is placed between interface chip 30 and interposer chip 40 and interposer chip 40 is positioned at the end of layered chip, there is no need to arrange through-electrodes in interface chip 30. Therefore, it is possible to prevent the period of time and cost of manufacturing interface chip 30 from increasing.

Further, since memory core chip 10 is provided with through-electrodes 12 that are required for the maximum value of the data bus width and interposer chip 40 is provided with DQ terminals that correspond to the maximum value of the data bus width, data can be input and output in accordance with the data bus width.

Also, since through-electrode 12 functions as a relay wire between interface chip 30 and interposer chip 40, the wiring is shorter than the wiring path on the chip surface and the transmission and reception speed of the signal and data becomes faster.

Second Embodiment

The second embodiment provides terminals to the signal lines for type setting described in the first embodiment so that the type-information is detectable. Incidentally, since the other elements are similar to those of the first embodiment, detailed explanations thereof are omitted. Also, since the operation of the memory module of the second embodiment is similar to that of the first embodiment, detailed explanations thereof are omitted.

Figure 7A:
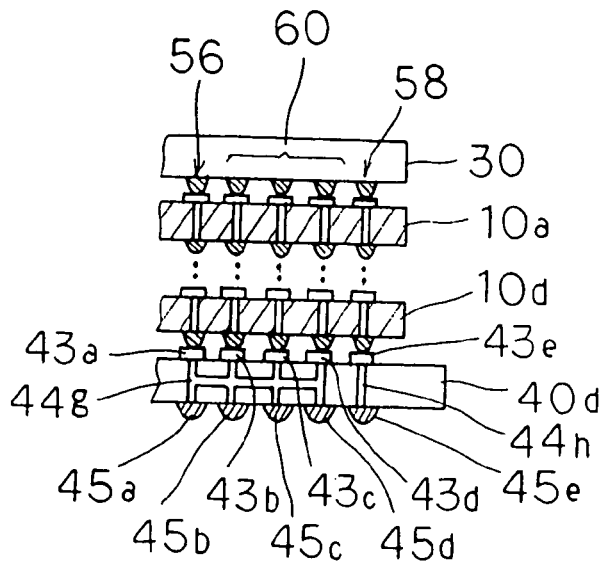
FIGS. 7A to 7C are principal cross-sectional views showing examples of the configuration of interposer chips according to a second embodiment.
Figure 7B:
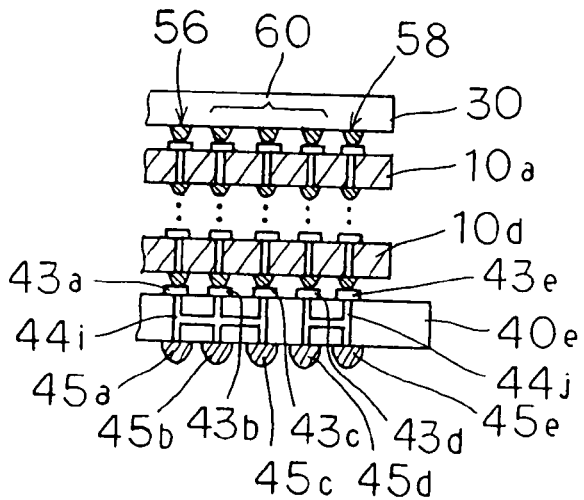
Figure 7C:
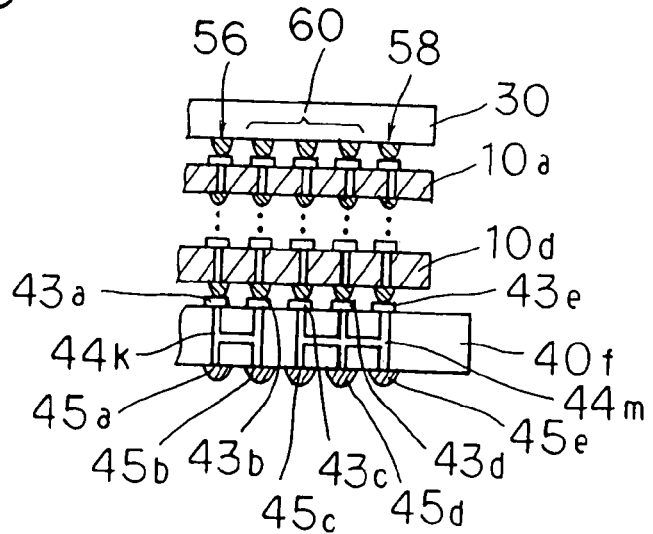

FIGS. 7A to 7C are principal cross-sectional views showing examples of the configuration of interposer chips according to the second embodiment. Incidentally, since the portion between memory core chips 10a and 10d is similar to that shown in FIG. 1, it is not shown. Further, similarly to the first embodiment, the information "1" is set when the signal line is held at the power supply potential, and the information "0" is set when the signal line is held at the ground potential.

In interposer chip 40d shown in FIG. 7A, solder ball 45a of power source line 56 is connected to bumps 43a, 43b, 43c, 43d through wire 44g. Further, in order to monitor the potentials of bumps 43b, 43c, 43d, each of bumps 43b, 43c, 43d is connected to each of solder balls 45b, 45c, 45d through wire 44g. Since the power supply potential is applied to bumps 43b, 43c, 43d of signal lines 60 for sending type-information, information (1, 1, 1) is input to interface chip 30. Interface chip 30 is set as the "×4 article" type according to information (1, 1, 1) from signal lines 60 for sending type-information, similarly to the first embodiment. On the other hand, since the potentials of solder balls 45b, 45c, 45d show information (1, 1, 1), it can be confirmed from the outside that the data bus width is set to four bits.

In interposer chip 40e shown in FIG. 7B, solder ball 45a of power source line 56 is connected to bumps 43a, 43b, 43c through wire 44i. Also, solder ball 45e of ground potential line 58 is connected to bumps 43d, 43e through wire 44j. Further, in order to monitor the potentials of bumps 43b, 43c, 43d, each of bumps 43b, 43c, 43d is connected to each of solder balls 45b, 45c, 45d. Since the power supply potential is applied to bumps 43b, 43c of signal lines 60 for sending type-information and since bump 43d of signal line 60 for sending type-information is connected to the ground potential, information (1, 1, 0) is input to interface chip 30. Interface chip 30 is set as the "×8 article" type according to information (1, 1, 0) from signal lines 60 for sending type-information, similarly to the first embodiment. On the other hand, since the potentials of solder balls 45b, 45c, 45d show information (1, 1, 0), it can be confirmed from the outside that the data bus width is set to eight bits.

In interposer chip 40f shown in FIG. 7C, solder ball 45a of power source line 56 is connected to bumps 43a, 43b through wire 44k. Also, solder ball 45e of ground potential line 58 is connected to bumps 43c, 43d, 43e through wire 44m. Further, in order to monitor the potentials of bumps 43b, 43c, 43d, each of bumps 43b, 43c, 43d is connected to each of solder balls 45b, 45c, 45d. Since the power supply potential is applied to bump 43b of signal line 60 for sending type-information and since bumps 43c, 43d of signal lines 60 for sending type-information are connected to the ground potential, information (1, 0, 0) is input to interface chip 30. Interface chip 30 is set as the "×16 article" type according to information (1, 0, 0) from signal lines 60 for sending type-information, similarly to the first embodiment. On the other hand, since the potentials of solder balls 45b, 45c, 45d show information (1, 0, 0), it can be confirmed from the outside that the data bus width is set to sixteen bits.

According to the second embodiment, by reading the potentials of solder balls 45b to 45d connected to signal lines 60 for sending type-information, the setting condition of the data bus width can be monitored, in addition to the effects of the first embodiment.

Third Embodiment

In the third embodiment, the signal line for type setting described in the second embodiment is independent of power source line 56 and ground potential line 58. Incidentally, since the other elements are similar to those of the first embodiment, detailed explanations thereof are omitted. Also, since the operation of the memory module of the third embodiment is similar to that of the first embodiment, detailed explanations thereof are omitted.

Figure 8:
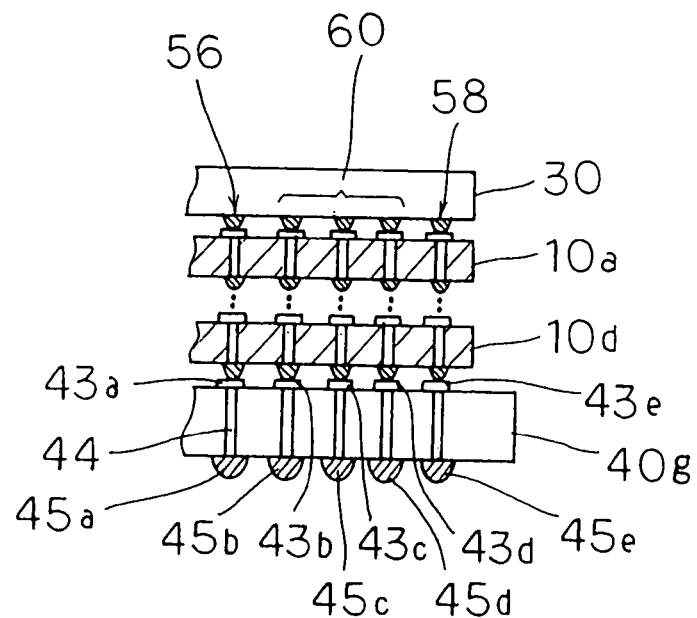
FIG. 8 is a principal cross-sectional view showing one example of the configuration of an interposer chip according to a third embodiment.

FIG. 8 is a principal cross-sectional view showing one configuration example of an interposer chip according to the third embodiment. Also, since the portion between memory core chips 10a, 10d is similar to that shown in FIG. 1, it is not shown.

In interposer chip 40g shown in FIG. 8, each of pads 43b, 43c, 43d of signal lines 60 for sending type-information is connected to each of solder balls 45b, 45c, 45d through wire 44. Signal lines 60 for sending type-information are electrically insulated from power source line 56 and ground potential line 58, differently from the first embodiment and the second embodiment. When a signal for type setting is input to solder balls 45b, 45c, 45d from the outside, the signal is input to interface chip 30 through signal lines 60 for sending type-information and the data bus width is set. The information that is input to interface chip 30 from signal lines 60 for sending type-information and the types of data bus widths that are set are similar to those of the first and second embodiments.

In the third embodiment, when interface chip 30 can operate in accordance with the type of the data bus width, by inputting type setting information about the number of bits to signal lines 60 for sending type-information from the outside after the memory module is mounted, the memory module can be used with the desirable data bus width.

Next, an example of the implementation of a memory module according to the third embodiment is explained. The memory module is subjected to type conversion in accordance with the amount of data that is input from the outside. In this description, the memory module of the third embodiment is implemented in a camera-equipped mobile telephone.

The camera-equipped mobile telephone has a storage section with stored voices and images and a control section for storing voice data and image data in the storage section, in addition to the usual telephone functions. The memory module of the third embodiment is used for the storage section. The control section executes a predetermined process according to a program that is previously stored. The program is described in a manner such that the data bus width of the memory module is set to "×8 article" mode when voices are stored and the data bus width of the memory module is set to "×16 article" mode when images are stored. Also, interface chip 30 is configured so that the data bus width type can be changed by signal line 60 for sending type-information.

Brief explanations are given of the operation of the memory module. In a case in which a message is recoded by a phone-answering function, when the type-information indicating the "×8 article" mode is input from the control section to the storage section, interface chip 30 makes memory core chip 10 operate as "×8 article". On the other hand, in a case in which an image taken by the camera is stored, when the type-information indicating the "×16 article" mode is input from the control section to the storage section, interface chip 30 makes memory core chip 10 operate as "×16 article". When the amount of information in the message is compared with that of the image, the amount of information in the image is larger. As a result, when the data bus widths are equal, the processing time for storing the image is longer than that for recording the message. However, by changing types, as described above, images having large data amounts can be stored still faster.

Fourth Embodiment

The fourth embodiment is characterized in that a plurality of memory core chips with different data bus widths is layered and an interface chip selects a memory core chip in accordance with type-information from the outside.

The configuration of the memory module according to the fourth embodiment is explained. Incidentally, detailed explanations are omitted of the same elements as in the first embodiment.

Figure 9:
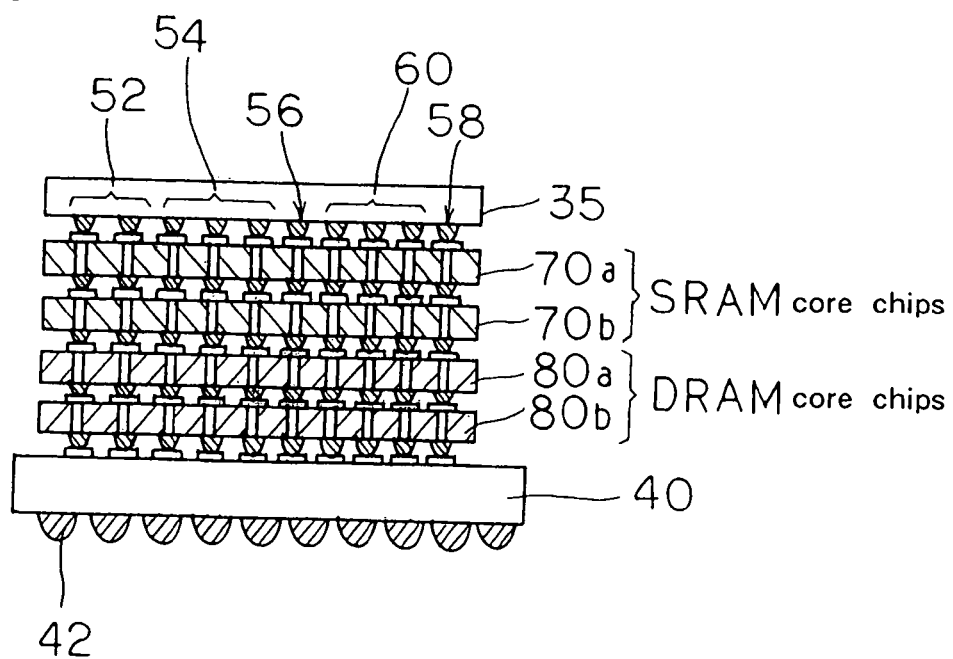
FIG. 9 is a schematic cross-sectional view for explaining one example of the configuration of a memory module according to a fourth embodiment.

FIG. 9 is a schematic cross-sectional view for explaining one example of the configuration of the memory module according to the fourth embodiment. In FIG. 9, wires in interposer chip 40 are omitted.

Memory core chips are configured in a manner such that SRAM (Static-RAM) core chips 70*a*, 70*b* and DRAM core chips 80*a*, 80*b* are layered. In the fourth embodiment, the data bus widths of SRAM core chips 70*a*, 70*b* are sixteen bits and the data bus widths of DRAM core chips 80*a*, 80*b* are eight bits.

The type-information that is input from interposer chip 40 to interface chip 35 through signal line 60 for sending type-information is used to select whether a chip that is to be operated is SRAM or DRAM.

Interface chip 35 is stored with information showing whether SRAM or DRAM is selected in accordance with the type-information. In this description, it is assumed that information "1" corresponding to SRAM core chips 70*a*, 70*b* and information "0" corresponding to DRAM core chips 80*a*, 80*b* are previously stored as the type-information.

Brief explanations are given of the operation of the memory module according to the fourth embodiment. When information "1" is input to interface chip 35 though signal line 60 for sending type-information, as the type-information, interface chip 35 makes SRAM core chips 70*a*, 70*b* operate with a data bus width of sixteen bits. On the other hand, when information "0" is input to interface chip 35 though signal line 60 for sending type-information, as the type-information, interface chip 35 makes DRAM core chips 80*a*, 80*b* operate with a data bus width of eight bits.

Incidentally, the data bus width is changed in accordance with the type of memory core chip, however, the information of the data bus width, as the type-information, may be separately input to interface chip 35, similarly to any one of the first to third embodiments. Also, the memory is not limited to RAM, a nonvolatile memory, e.g., a flash memory, may be used.

According to the fourth embodiment, type-information is used to select the memory core chip, and the interface chip enables the predetermined memory core chip from among the layered memory core chips to operate in accordance with the type-information. Not only various types of memories can be layered, but also the data bus width can be changed in accordance with the type of the memory core chip.

Additionally, in the first to fourth embodiments, bumps 32 of interface chip 30 are positioned to correspond to through-electrodes 12 of memory core chip 10*a*, however, a conversion layer for converting the pitch and the arrangement to connect electrodes may be arranged between interface chip 30 and memory core chip 10*a*. When the number of transistors that are mounted on interface chip 30 is smaller than that of memory core chips 10, there will be a situation in which the chip size of interface chip 30 is smaller than memory core chip 10. In this case, the conversion layer performs electrical connections between bumps in accordance with the signal lines of interface chip 30 and memory core chip 10. When the number of bumps of both chips does not coincide and the bumps are not in one-to-one correspondence, a circuit for enabling transmission and reception of signals and data between chips may be arranged in the conversion layer. When this conversion layer is arranged, it is available in any one of the above-described embodiments though the interface chip can be in any size. Also, though bonding pads of the interface chip are arranged in any manner, it is available in any one of the above-described embodiments. The conversion layer may be formed in a chip shape or a film shape.

Figure 10A:
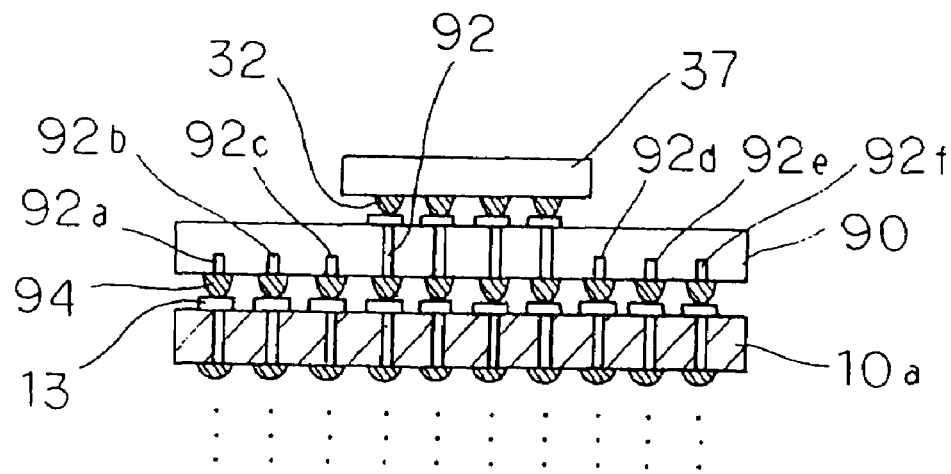
FIG. 10A is a cross-sectional view showing one example of the configuration of a conversion layer.
Figure 10B:
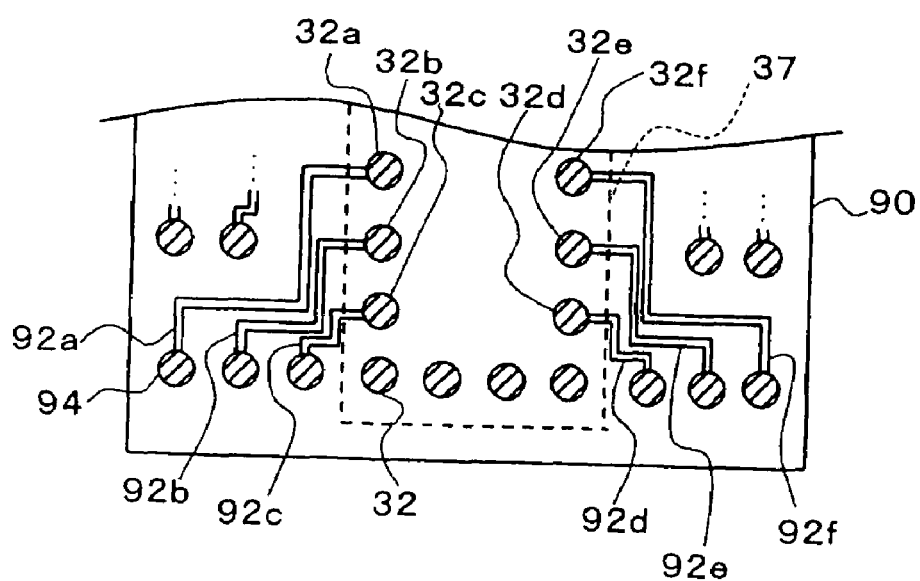
FIG. 10B is a perspective plan view showing one example of the configuration of the conversion layer.

FIG. 10A is a cross-sectional view showing one example of the configuration of the conversion layer, and FIG. 10B is a perspective plan view thereof. Incidentally, in FIG. 10A, the configuration below memory core chip 10*b* is similar to that in FIG. 1, and therefore it is not shown. As shown in FIG. 10A, conversion layer 90 is arranged between interface chip 37 and memory core chip 10*a*. Bump 94 that is electrically connected to bump 13 of memory core chip 10*a* is connected to bump 32 of interface chip 37 through wire 92. Wires 92*a* to 92*f* shown in FIG. 10A extend in the vertical direction of figure from midpoints and are connected to bumps (not shown) of interface chip 37. As shown in FIG. 10B, each of wires 92a to 92f in conversion layer 90 is connected to each of bumps 32a to 32f of interface chip 37.

Further, in the first to fourth embodiments, the maximum value of the data bus width is sixteen bits, however, it may be thirty-two or sixty-four, which is larger than sixteen.

Also, the capacity of the type-information is three bits, however, the capacity is not limited to three bits. When there are only two data bus widths that are selectable, the capacity of the type-information may be one bit.

Further, the memory core chip may be formed in a single layer. In this case, it can be operated by changing the data bus width for the single layer memory core chip.

Further, as one example of the method for identifying each memory core chip out of memory core chips 10a to 10d, ID circuit 24 is arranged for each memory core chip and ID recognition control section 22 is arranged in interface chip 30. However, each memory core chip may be identified by another method.

While preferred embodiments of the present invention have been described using specific terms, such description is for illustrative purposes only, and it is to be understood that changes and variations may be made without departing from the spirit or scope of the following claims.

What is claimed is:

1. A memory module having a memory core chip stored with information, an interface chip for controlling input and output of data of said memory core chip, and an interposer chip for transmitting and receiving said data between said interface chip and an outside:
   wherein said memory core chip is placed between said interface chip and said interposer chip and has a relay wire for electrically connecting said interface chip and said interposer chip;
   wherein said interposer chip transmits type-information, that is information showing a type of said memory core chip, to said interface chip through said relay wire; and
   wherein said interface chip controls said memory core chip in accordance with said type-information received from said interposer chip.

2. The memory module according to claim 1, wherein a plurality of said memory core chips is layered and a through-electrode is used as said relay wire.

3. The memory module according to claim 2, wherein said plurality of memory core chips includes a first memory core chip and a second memory core chip that is different from said first memory core chip, and wherein said type-information indicates whether said first memory core chip or said second memory core chip is to be used.

4. The memory module according to claim 1, wherein said type-information is a data bus width.

5. The memory module according to claim 4, wherein said type-information includes at least one bit of information showing a type of said data bus width, and wherein said interface chip is previously stored with the type of said data bus width in accordance with said type-information.

6. The memory module according to claim 5, wherein said interposer chip includes:
   a power supply potential terminal to which a power supply potential is supplied from the outside, and a ground potential terminal that is connected to a ground potential on the outside;
   a setting wire that is connected to said power supply potential terminal or said ground potential terminal in accordance with said type-information while a potential is selected from among said power supply potential and said ground potential based on said one bit of information that has been created; and
   an electrode for connecting said setting wire to said relay wire.

7. The memory module according to claim 6, wherein said interposer chip includes a terminal for detecting an electric potential showing said type-information.

8. The memory module according to claim 4, wherein said relay wire of said memory core chip is arranged so as to correspond to a maximum value of said data bus width, and wherein said interposer chip includes a terminal for inputting and outputting said data from/to the outside and for supporting the maximum value of said data bus width.

9. The memory module according to claim 1, wherein said interposer chip includes a terminal for receiving said type-information from the outside.

10. The memory module according to claim 1, further comprising a conversion layer between said interface chip and said memory core chip, for electrically connecting an electrode of the interface chip and said relay wire of the memory core chip.

11. The memory module according to claim 1, further comprising a conversion layer between said interface chip and said memory core chip.

12. The memory module according to claim 1, wherein said relay wire comprises a plurality of through electrodes.

13. The memory module according to claim 12, wherein said plurality of through electrodes comprises electrodes that are not connected to an internal circuit of said memory core chip and electrodes that are connected to the internal circuit of said memory core chip.

14. The memory module according to claim 13, wherein said electrodes that are not connected to the internal circuit of said memory core chip input and output a control signal and data to and from the outside of the memory module.

15. The memory module according to claim 13, wherein said electrodes that are connected to the internal circuit of said memory core chip transmit a signal and data to another chip.

16. The memory module according to claim 13, wherein said electrodes that are not connected to the internal circuit of said memory core chip relay a signal and data between said interface chip and said interposer chip.

17. The memory module according to claim 1, wherein said interface chip is laid over said memory core chip so that a circuit information surface of said interface chip is on a side of a circuit information surface of said memory core chip.

* * * * *